United States Patent [19]

Sokolich

[11] Patent Number: 4,465,972
[45] Date of Patent: Aug. 14, 1984

[54] CONNECTION ARRANGEMENT FOR PRINTED CIRCUIT BOARD TESTING APPARATUS

[75] Inventor: James M. Sokolich, Cliffside Park, N.J.

[73] Assignee: Allied Corporation, Morris Township, Morris County, N.J.

[21] Appl. No.: 365,670

[22] Filed: Apr. 5, 1982

[51] Int. Cl.$^3$ .................. G01R 31/02; G01R 15/12; G01R 1/06

[52] U.S. Cl. ..................... 324/158 F; 324/73 PC; 324/158 P

[58] Field of Search ............. 324/73 R, 73 PC, 158 F, 324/158 P

[56] References Cited

U.S. PATENT DOCUMENTS

| | | | |
|---|---|---|---|
| 3,723,867 | 3/1973 | Canarutto | 324/73 PC |
| 3,946,310 | 3/1976 | Saper et al. | 324/73 PC X |
| 4,164,704 | 8/1979 | Kato et al. | 324/158 P X |
| 4,340,858 | 7/1982 | Malloy | 324/158 P |
| 4,417,204 | 11/1983 | Dehmel et al. | 324/73 PC |

FOREIGN PATENT DOCUMENTS

| | | | |
|---|---|---|---|
| 1316108 | 5/1973 | United Kingdom | 324/73 PC |
| 2085673 | 4/1982 | United Kingdom | 324/73 PC |

Primary Examiner—Gerard R. Strecker
Attorney, Agent, or Firm—Stanley N. Protigal; Anthony F. Cuoco

[57] ABSTRACT

Printed Circuit Board Testing Apparatus is disclosed which utilizes a "bed of nails" of contacts with conductive probes mounted in an insulating plate on a grid of 0.050 inch spacing to make a plurality of electrical contacts with a printed circuit board under test. This large number of contacts are all connected to the edge of a plurality of printed circuit boards mounted perpendicular to the back of the plate. Paths on each of these printed circuit boards electrically connect the probes of the contacts to a large scale integrated circuit chip on which are a plurality of analog switches each controlled by one bit of a binary word stored in a multi-stage shift register also on the chip. One side of each switch is connected to a probe while the other side of the switches are tied together in busses to create a multiplexing arrangement to thereby connect ones of the large number of probes to a relatively small number of input/output leads also connected to the printed circuit boards. In operation, selected ones of the analog switches on each chip are operated by serially loading binary words into the shift register on each chip to thereby operate switches and connect the board under test via the input/output leads to test circuitry.

6 Claims, 5 Drawing Figures

CONNECTION ARRANGEMENT FOR PRINTED CIRCUIT BOARD TESTING APPARATUS

BACKGROUND OF THE INVENTION

This invention relates to automated testing of printed circuit boards.

In the prior art, automated testing of newly manufactured printed circuit boards without components has been accomplished by making electrical connection to a large number of points on the board and then tests for continuity and shorts are performed to locate faults which are then corrected. One approach to making these electrical connections is to use what is known in the art as a bed of nails which is a matrix of contacts having spring loaded conductive probes arranged in rows and columns with a contact typically being spaced from adjacent contacts by 0.100 inches or 0.050 inches. Electrical connection to each of these contacts is via a wire fastened to the rear of each contact and the wires are also connected to switching equipment and test circuitry. Installation of these wires to contacts spaced 0.050 inches apart requires wires having diameters in the order of 0.040 inches including the insulation. Assembly is a relatively costly and time consuming manufacturing operation. In addition, due to the small wire size wire breakage is a problem and repair is difficult due to the large number of wires in a relatively small space. For a tester having contacts spaced 0.050 inches apart, testing a board 3 inches by 5 inches requires 6,000 contacts with wires connected thereto. All these wires must also be attached to relays and other circuitry to establish the connections and perform tests.

Thus, there is a need in the art for a relatively simple, easy to manufacture and inexpensive bed of nails printed circuit board tester.

SUMMARY OF THE INVENTION

The foregoing problems of the prior art are solved by my novel printed circuit board testing apparatus having a bed of nails connector arrangement with contacts spaced 0.050 inches apart. To implement my invention I utilize a relatively thick, electrically insulating plate through which are holes arranged in rows and columns and center-to-center spaced 0.050 inches. The plate is relatively thick for the primary purpose of structural stability. Within each hole is a contact made up of a spring loaded conductive probe assembled in a conductive sleeve. The probe points all extend in the same direction and the points all lie in one plane. As the plate with contacts assembled therein is pushed up against a printed circuit board under test each probe recedes into its sleeve against the spring located therein. The back end of each contact protrudes from the back of the plate for the purpose of making an electrical connection thereto. Thus, the back end of the contacts protruding from the rear of the plate are also arranged in rows and columns.

At the rear of the insulating plate are located a plurality of small printed circuit boards oriented parallel to each other, and all these boards are perpendicular to the rear of the plate. The edge of each board closest to the rear of the plate is parallel to and equidistant from two adjacent rows of contact back ends. On each side of the edge of each board closest to the rear of the plate are located connectors which are spaced 0.050 inches apart. The back end of each contact extending through the plate is in line with and inserts into one of these connectors to establish an electrical connection between them. These connectors are connected via printed circuit paths on each board to an integrated circuit chip carrier mounted on each board to thereby be connected to a custom integrated circuit mounted in each chip carrier. In this manner the bed of nails probes are all connected to an integrated circuit on one of the rear mounted printed circuit boards without the use of wires.

The custom integrated circuit on each rear mounted printed circuit board is used to multiplex the probes electrically connected thereto to a microprocessor and test equipment to set up connections and perform tests. Each integrated circuit chip has a plurality of electronic analog switches thereon with one side of each of two switches being connected to one probe. The other side of each of these two switches is connected to a different one of two busses. Thus, each probe can be connected to one of the two busses on each chip by operation of one of its two associated analog switches. Also located on each integrated circuit chip is a shift register and each stage thereof is associated with and is used to operate one analog switch. When a binary one is stored in a stage of the shift register it causes the operation of the associated analog switch so an electrical connection is established through the switch. The microprocessor is used to load a binary number into the shift register on each integrated circuit to thereby cause the operation of specific switches. The two busses on each integrated circuit, as well as the inputs to the shift register are connected via a conventional printed circuit board edge connector on each rear mounted board and interconnecting printed circuit paths and wires to the microprocessor and test circuitry. In addition, the shift registers on the rear mounted boards are interconnected via the edge connectors. In this manner electrical connections may be established to combinations of points on a printed circuit board under test via the bed of nails probes to make continuity and short tests without the use of many discrete wires.

DESCRIPTION OF THE DRAWING

The invention will be better understood upon reading the following detailed description in conjunction with the drawing in which.

DETAILED DESCRIPTION

Figure 1:
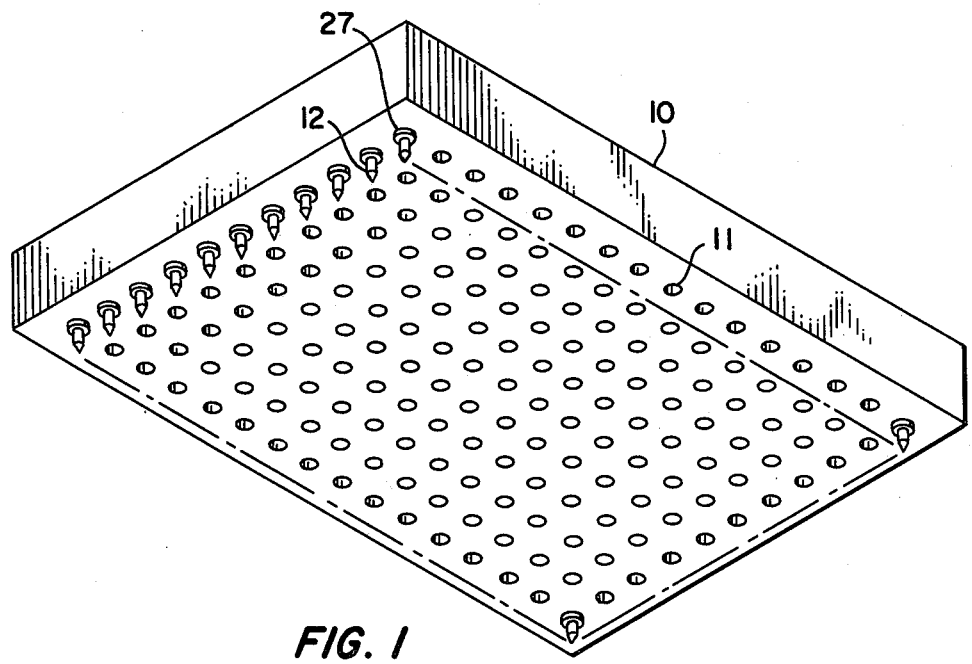
FIG. 1 shows a bed of nails plate with the spring loaded probes extending therefrom.
Figure 2:
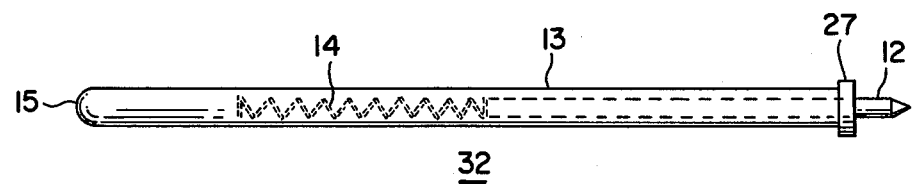
FIG. 2 shows the details of a single conductive probe mounted in the plate.
Figure 3:
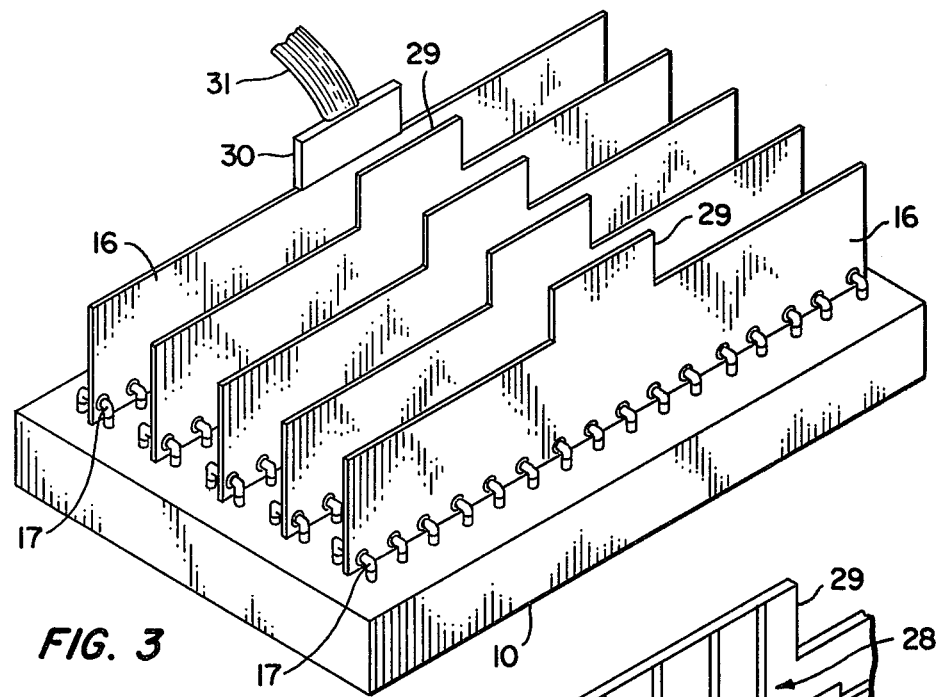
FIG. 3 generally shows a pictorial representation of the top of the insulating plate.
Figure 4:
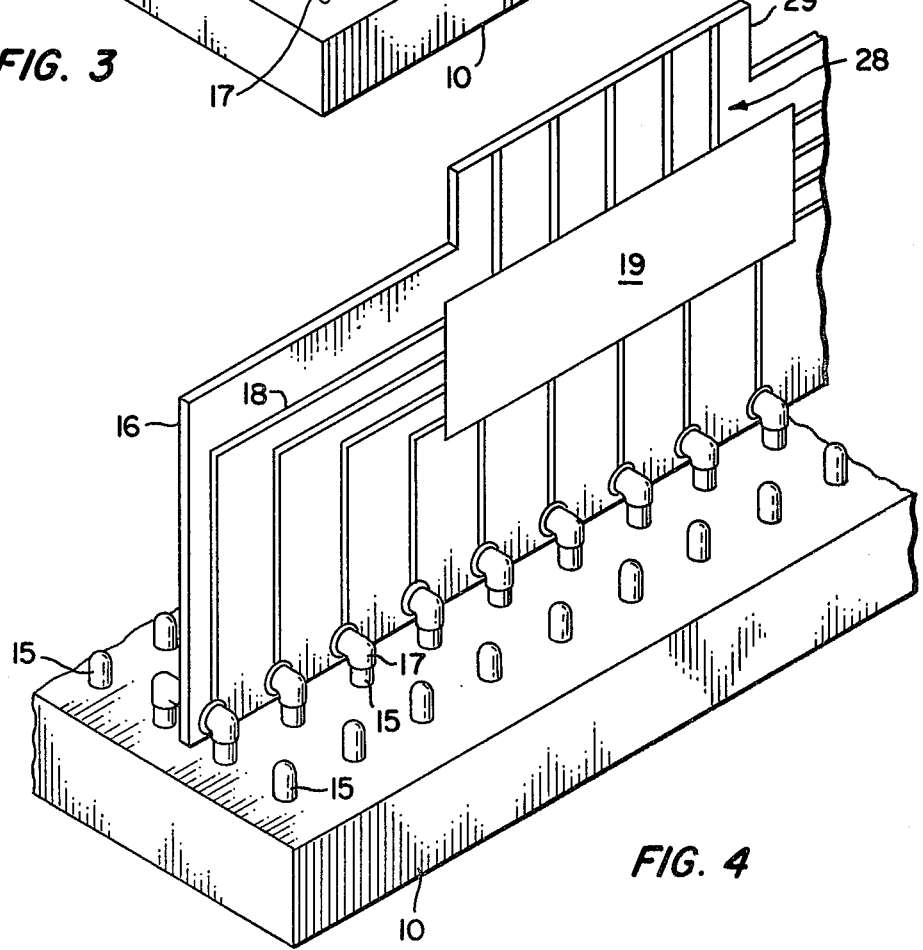
FIG. 4 shows details of one printed circuit board mounted on the rear of the insulating plate.

In FIG. 1 is shown a bottom view of an insulating plate 10 in which are protruding conductive probes 12 to make up the bed of nails for making electrical contacts to a printed circuit board under test. The probes 12 extend from assembled contact assemblies 32 which are shown in detail in FIG. 2. Referring to FIG. 1 the insulating plate 10 is in the order of ⅜ inches thick and has a plurality of columns and rows of holes 11 therethrough which are all center-to-center spaced 0.050 inches from each other. Within each of holes 11 is inserted a contact assembly 32 which is shown in detail in FIG. 2. These contact assemblies are available from Pylon Inc., Box 79, Attleboro, Mass. 02703 and is identified as their model P2662A series. Contact assembly 32 consists of an outer body 13 with a back end 15 by which electrical connections are made to contact 32. Body 13 is hollow and has an enlarged end 27. Inside body 13 is a spring 14 and conductive probe 12. Probe 12 is shown as pointed but it is also available rounded or flat. Typical dimensions of contact assembly 32 are the expanded end 27 being 0.042 inches diameter while the shaft of body 13 has a diameter of 0.037 inches. The diameter of probe 12 is 0.021 inches and is made of gold plated hardened beryllium copper. Body 13 is made of gold lined nickel silver while spring 14 is made of beryllium copper. In its relaxed state probe 12 extends approximately 0.10 inches from body 13 and under external pressure is depressed back inside body 13. One of the contact assemblies 32 shown in FIG. 2 is inserted back end 15 first into each of holes 11 through plate 10. When fully inserted into hole 11 expanded portion 27 of contact assembly 32 seats against the bottom of plate 10. The 0.050 spacing between holes 11 prevents the contact assembly 32 in one hole 11 from touching a contact assembly 32 in an adjacent hole 11. Upon complete assembly each of the probes 12 of contact assemblies 32 protrude from the bottom of plate 10 as shown in FIG. 1 while back end 15 of each of the contact assemblies 32 extend from the rear of plate 10 as shown in FIGS. 3-4. In operation plate 10 is pressed down onto a printed circuit board under test (not shown) and the pressure of plate 10 against the printed circuit board under test is sufficient to make good electrical connection between ones of probes 12 and the printed circuit board under test. This pressure is usually sufficient to depress each probe 12 partially inside its respective body 13.

In FIG. 3 is shown a general pictorial representation of the top side of plate 10 on which are mounted a plurality of printed circuit boards 16 each having a plurality of female connectors 17 for making an electrical connection to the back end 15 of the contacts 32 inserted through holes 11 of plate 10. Each of boards 16 has the female connectors 17 mounted on either side thereof and the center-to-center spacing of connectors 17 on either side of each board 16 is 0.050 inches. These connectors 17 establish connections to the back ends 15 of contact assemblies 32 in two adjacent rows as shown in greater detail in FIG. 4. Further, there is a retainer assembly (not shown) which mounts over the top of the plurality of printed circuit boards 16 to hold them in position while providing access for edge connectors 30 to board extensions 29. On each of these boards 16 is located an integrated circuit connected to connectors 17 via printed circuit paths. The integrated circuit is used for multiplexing the plurality of probe inputs via connectors 17 to a relatively small number of output leads which appear at extension 29 of each of printed circuit boards 16. Electrical connection is made to an extension 29 via a board connector 30 with cable 31 in a manner well known in the art. Cable 31 is connected to a microprocessor and other circuitry (not shown) for controlling the integrated circuitry on each of boards 16 to test for continuity and shorts on a printed circuit board under test. Some wires within cable 31 will also go to other connectors 30 (not shown) on other boards 16 to interconnect circuitry on the integrated circuits.

In another arrangement one of boards 16 does not connect to any back ends 15 and the microprocessor and chips containing a testing program are located thereon. A mechanical frame holds the edge connectors 30 which are in turn interconnected by another printed circuit board. Even fewer discrete wires are required with such a configuration.

The dimensional scale of the elements shown in FIG. 3 is not meant to be accurate but only to help understand the basic assembly of the elements. In addition, a single circuit board 16 is shown as covering two adjacent rows of back ends 15 via the female connectors 17 mounted on the edge of the board. In reality, a board 16 will comprise a plurality of smaller boards each having an integrated circuit thereon (not shown) and its own extension 29 via which electrical connections are established via a connector 30. For testing printed circuit boards of three inches by five inches using the 0.050 inch spacing a total of 6,000 contacts are made to all the boards 16 via connectors 17. These 6,000 connections are reduced by the multiplexing action of the integrated circuits on ones of printed circuit boards 16 to a relatively few number of leads.

In FIG. 4 is shown in detail a close-up of a portion of what is generally shown in FIG. 3. Again, physical dimensions are not accurate but are chosen to more easily explain the invention. For example, the number of printed circuit paths 18 and 28 shown on an exemplary circuit board 16 are not accurate but are sufficient to understand the present invention. Only a portion of an exemplary printed circuit board 16 is shown to avoid cluttering up the Figure. Circuit board 16 is mounted vertical to plate 10 between two adjacent rows of back ends 15. On both sides of the bottom edge of each printed circuit board 16 are physically mounted a plurality of female connectors 17 having a center-to-center spacing of 0.050 inches. In assembly these female connectors 17 establish an electrical connection to each of the back ends 15 protruding from plate 10. These connectors 17 each are electrically connected to a circuit path 18 on one of the two sides of circuit board 16. Many other connecting arrangements may be utilized to electrically connect board 16 to end 15 of each of the connectors 32 such as connectors 17 all being part of a unitary assembly on the edge of board 16. Mounted on each printed circuit board 16 is an integrated circuit chip carrier 19 which is electrically connected to each of printed circuit paths 18 and also to printed circuit paths 28. Integrated circuit chip carrier 19 is not shown in detail as it is well known in the art. The chip carrier used in the preferred embodiment of the invention is a model PB-12803-C available from Kyocera International, Inc. located on U.S. Highway 22, Bridgewater, N.J. 08807 and who is a distributor for Kyoto Ceramic Company, Ltd. of Kyoto 607, Japan. Mounted in integrated chip carrier 19 is a custom integrated circuit 20 (not shown) which is now generally described with reference to FIG. 5.

Figure 5:
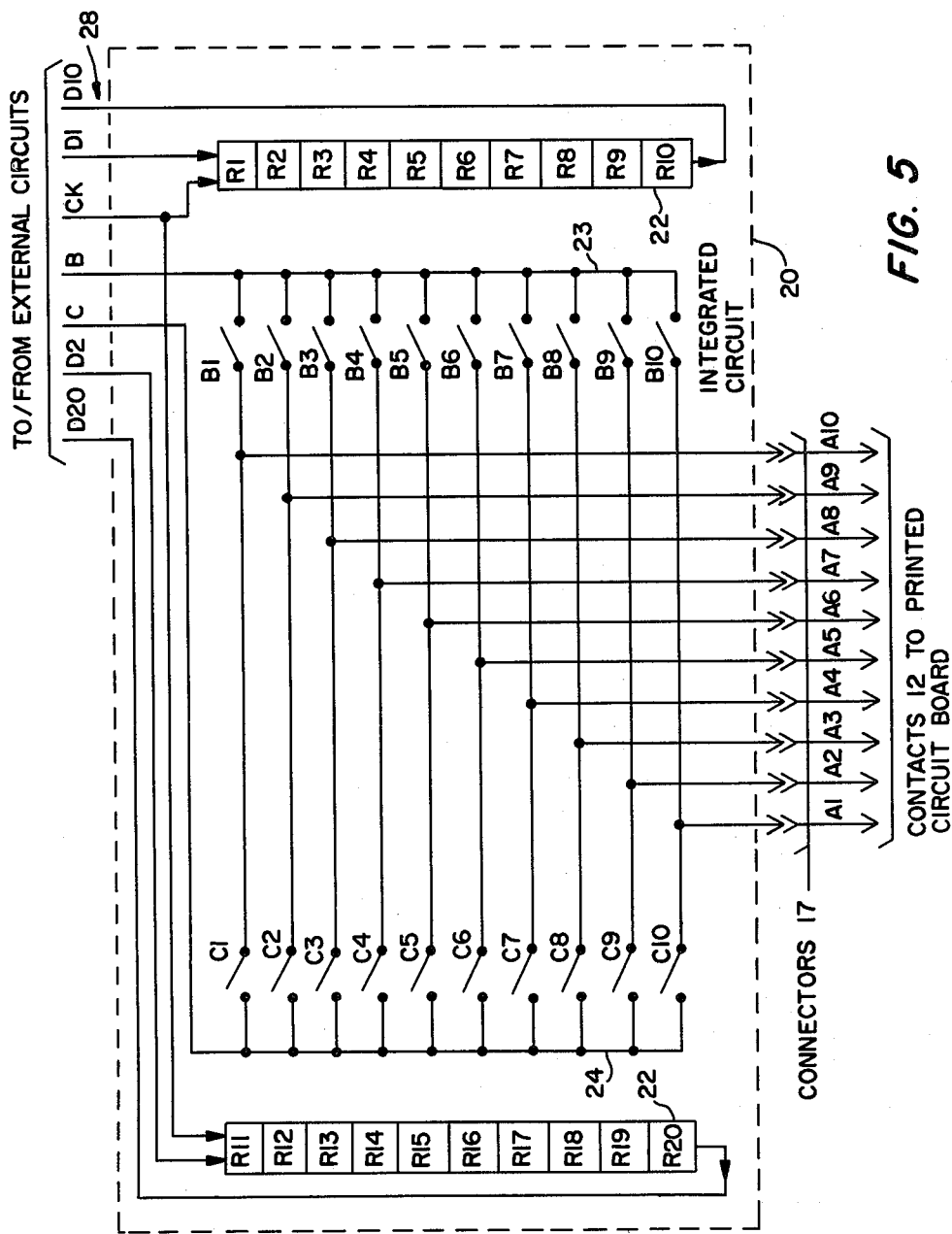
FIG. 5 shows a circuit diagram of the invention.

In FIG. 5 is shown an exemplary multiplexing circuit located on an integrated circuit 20 which mounts in the integrated circuit chip carrier 19 on each of printed circuit boards 16. Leads A1 through A10 represent ten probes 12 protruding from the bottom of plate 10 to make electrical connection with a printed circuit board under test. These electrical connections are passed back through female connectors 17 on the edge of printed circuit boards 16, printed circuit paths 18, and integrated circuit chip carrier 19 to integrated circuit 20. The number of input and output connections to integrated circuit 20 is only exemplary and, in reality, there are many more. Within integrated circuit 20 are located a plurality of analog switches B1 through B10 and C1 through C10. Analog switches B1 to B10 and C1 to C10 are each N channel enhancement mode MOS switches connected and operated in a manner well known in the art to implement analog switches. Also located on integrated circuit 20 is a serial shift register 22 which, in this simplified representation, comprises twenty stages R1 through R20. Analog switches C1 through C10 have one side thereof connected to the probes A1 through A10 as shown and have the other side thereof connected to a bus 24 which appears at lead C of input/output leads 28. Analog switches B1 through B10 are also connected to probes A1 through A10 and via bus 23 to lead B of leads 28. Also included within leads 28 are clocking lead CK, data input leads D1 and D2, and data output leads D10 and D20 all used for the operation of serial shift register 22. As previously described, printed circuit board connectors 30 establish electrical connection from leads 28 to other circuitry. In operation, binary ones and zeros are serially applied over input leads D1 and D2 respectively to stages R1 and R11 of shift register 22 and are clocked therein by clock pulses on lead CK. Operating in a manner well known in the art two serial strings of ten binary zeros and ones are clocked into the twenty stages of shift register 22 by clock pulses on lead CK. The output of the individual shift register stages R1 through R20 of shift register 22 are connected to and used to operate the twenty analog switches B1 through B10 and C1 through C10. For example, if shift register 22 stage R7 has a one stored therein analog switch B7 will be operated to electrically connect probe A4 through to bus 23 and off board 16 via lead B. Shift register stages having zeros stored therein will not cause the operation of their associated analog switches. In the present embodiment of the invention shift register stage R10 is connected via lead D10 to stage R1 of another integrated circuit 20 on another circuit board 16, and so on, to create a chain for the loading of binary numbers into shift register 22. The same applies to stage R20 and lead D20.

For example, if the testing system looks for a continuity caused by a circuit path that will be detected between contacts A1 and A10, the twenty bit binary word loaded into shift register 22 will have ones stored only in stages R1 and R20 or, alternatively, stages R10 and R11. In the first case analog switches B1 and C10 are operated to connect contacts A1 and A10 through to leads B and C so that continuity between these contacts may be tested for by external circuits (not shown). The same result occurs in the later case when the ones are stored in stages R10 and R11 to correspondingly operate analog switches B10 and C1. This example depends upon the printed circuit path being checked for being positioned on the printed circuit board under test as to be contacted by contacts A1 and A10 associated with a single board 16. This example is a special case. In reality the printed circuit path being checked for on the board under test may be detected by a probe associated with the integrated circuit 20 on one printed circuit board 16 and the other end of the printed circuit path will be contacted by a probe connected to an entirely different board 16. In this case, the unused one of the busses 23 and 24 on the integrated circuit 20 of the two different printed boards 16 may be used to concurrently check for a continuity or short of another printed circuit path on the board under test. In addition, while this embodiment of the invention only discloses two busses 23 and 24, a single integrated circuit 20 may have more than two busses correspondingly connected to more than one output lead to be connected to external circuits, and more than one shift register may be utilized. This allows for more complex testing arrangements.

While what has been described hereinabove is one embodiment of the invention those skilled in the art can make many modifications thereto without departing from the spirit and scope of the invention. For example, the application described hereinabove is for making continuity and short tests on printed circuit boards before any components are mounted thereon. However, the present invention may also be utilized to contact printed circuit boards on which components are already mounted to test the boards. For example, a resistance may be detected between two of the probes A1 through A10 which are connected back over leads B and C of input/output leads 28 to an external circuit (not shown) which measures the resistance to determine if it is a proper value. Similarly, other components on an already assembled printed circuit board under test may be tested.

Further, another rear mounted printed circuit board may be mounted parallel to boards 16 but not be connected to any back ends 15. On this additional board would be mounted the microprocessor and ROM chips containing the testing program. This additional board(s) would have an extension 29 and the framework on which are mounted edge connectors 30 would be used to interconnect all the boards. The edge connectors 30 could be interconnected via paths on yet another printed circuit board connected to connectors 30. This reduces the number of discrete wires even further.

In addition, in order to improve the accuracy of electrical measurements made on printed circuit boards under test, auxiliary electronic switches and busses may be provided on the integrated circuits, which auxiliary electronic switches are operated only when all the contact 32 probe tips 12 are not in electrical contact with a printed circuit board. The auxiliary electronic switches are used to establish electrical connections to the primary electronic switches used in normally connecting test equipment to printed circuit boards under test. Other test equipment is connected via the auxiliary electronic switches to the primary electronic switches to measure electrical characteristics of the primary switches when they are operated and unoperated.

What is claimed is:
1. An arrrangement for electrically connecting printed circuit boards under test to test apparatus, said connecting arrangement comprising:
   a plurality of conductive probes in a predetermined arrangement and placed against a printed circuit board under test to establish a plurality of electrical connections thereto;
   an insulating plate receiving the probes in said predetermined arrangement and capable of supporting the probes against ones of the printed circuit boards under test when said plurality of conductive probes are mounted in holes through the plate and extending out of either side of said plate;
   a plurality of first printed circuit board means mounted substantially perpendicular to said plate with one end of said contact probes being electrically connected to first conductive paths on said plurality of first board means; and
   integrated circuit means mounted to said first printed circuit board means and connected to said first conductive paths, the integrated circuit means con- necting selected ones of said plurality of conductive probes to said testing apparatus to test electrical characteristics of said printed circuit board under test, the integrated circuit connecting means including a plurality of electronic switches organized into at least two groups with one side of each switch connected to a bus, and a multi-bit storage means wherein each bit location of said storage means is associated with at least one of said electronic switches, the binary number contents of a bit location of said storage means is used to control the operation of the associated switches, and a multi-bit binary number is placed in said stoage means to control the operation of said electronic switches, said integrated circuit means comprising individual integrated circuits on each of said plurality of first printed circuit boards, wherein said storage means comprises an individual storage means on each of said individual integrated circuits, and wherein said plurality of electronic switches comprises an individual plurality of electronic switches on each of said individual integrated circuits, said first conductive paths connecting said probes to said electronic switches which are selectively operated to connect said probes to said busses and thence to said testing apparatus.

2. The invention in accordance with claim 1 wherein said first printed circuit board means have second conductive paths connected to said busses and to said storage means and further comprising: ;p1 connector means for contacting said second conductive paths on said first printed circuit means, and second printed circuit board means on which said connector means are mounted and conductive paths on said second board means interconnect said connector means and connect said busses to said testing apparatus.

3. The invention in accordance with claim 2 wherein each of said individual storage means on each of said individual integrated circuits comprises a shift register into which a portion of said multi-bit binary number is stored.

4. The invention in accordance with claim 3 wherein all of said electronic switches comprise metallic oxide enhancement mode switches which provide analog switch operation to connect selected contact probes to said testing apparatus.

5. The invention in accordance with claim 4 wherein said plate is made of an electrical insulating material.

6. The invention in accordance with claim 1 wherein said integrated circuit means comprises:

first switch means to establish the electrical connections between said conductive probes and said testing apparatus, and second switch means for establishing electrical connections to ones of said conductive probes when they are not placed against a printed circuit board under test, said last mentioned electrical connections being used in conjunction with said test apparatus to measure electrical characteristics of ones of said first switch means.

* * * * *